US011769545B2

(12) United States Patent
Raj et al.

(10) Patent No.: US 11,769,545 B2
(45) Date of Patent: Sep. 26, 2023

(54) LOW-LEAKAGE ROW DECODER AND MEMORY STRUCTURE INCORPORATING THE LOW-LEAKAGE ROW DECODER

(71) Applicant: GLOBALFOUNDRIES U.S. Inc., Malta, NY (US)

(72) Inventors: Vivek Raj, Bangalore (IN); Vinayak R. Ganji, Bangalore (IN); Shivraj G. Dharne, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 100 days.

(21) Appl. No.: 17/498,788

(22) Filed: Oct. 12, 2021

(65) Prior Publication Data

US 2023/0115230 A1 Apr. 13, 2023

(51) Int. Cl.
*G11C 8/08* (2006.01)
*G11C 11/408* (2006.01)
(Continued)

(52) U.S. Cl.
CPC ...... *G11C 11/4085* (2013.01); *G11C 11/4074* (2013.01); *G11C 11/4076* (2013.01); *G11C 11/4096* (2013.01)

(58) Field of Classification Search
CPC . G11C 11/418; G11C 11/419; G11C 11/4085; G11C 11/4074; G11C 11/4076; G11C 11/4096
See application file for complete search history.

(56) References Cited

U.S. PATENT DOCUMENTS 5,610,533 A * 3/1997 Arimoto ............ H03K 19/0016
327/537
5,610,872 A * 3/1997 Toda ................... G11C 11/4096
365/189.11
(Continued)

OTHER PUBLICATIONS

Saini et al., "Low Power Circuit Techniques for Optimizing Power in High Speed SRAMs," 2016 International Conference on Advances in Computing, Communications and Informatics (ICACCI), 2016, pp. 1-6.
(Continued)

*Primary Examiner* — Mushfique Siddique
(74) *Attorney, Agent, or Firm* — David Cain; Hoffman Warnick LLC

(57) ABSTRACT

Disclosed are embodiments of a low-leakage row decoder and a memory circuit incorporating the row decoder. The row decoder includes wordline driver circuitry including first devices (pre-drivers) and second devices (wordline drivers). Each second device is connected in series between a first device and a wordline for a row in a memory array. The first devices can be directly connected to a positive supply voltage rail and connected to a ground rail through a footer. The second devices can be connected to the positive supply voltage rail through a header and directly connected to the ground rail. The on/off states of the header and footer are controlled by clock signal-dependent control signals so that they are either concurrently on or off. With this configuration, leakage power consumption of the wordline driver circuitry is minimized while the memory structures as idle and also while it operates in a normal active mode.

20 Claims, 6 Drawing Sheets

(51) Int. Cl.
 *G11C 11/4096* (2006.01)
 *G11C 11/4074* (2006.01)
 *G11C 11/4076* (2006.01)

(56) References Cited

U.S. PATENT DOCUMENTS

| | | | | |
|---|---|---|---|---|
| 5,936,910 | A * | 8/1999 | Hashimoto | G11C 29/34 |
| | | | | 365/201 |
| 7,218,153 | B2 | 5/2007 | Chen | |
| 2010/0165778 | A1 | 7/2010 | Dudeck et al. | |
| 2013/0111130 | A1 | 5/2013 | McCombs et al. | |
| 2015/0085566 | A1* | 3/2015 | Jain | G11C 8/08 |
| | | | | 365/230.03 |
| 2016/0049191 | A1* | 2/2016 | Siddiqui | G11C 8/08 |
| | | | | 365/154 |
| 2020/0075070 | A1* | 3/2020 | Gupta | G11C 11/419 |
| 2022/0020405 | A1* | 1/2022 | Kumar | G11C 5/14 |

OTHER PUBLICATIONS

Zhang et al. "A 55-nm Ultra Low Leakage SRAM Compiler with Optimized Power Gating Design," IETE Technical Review, vol. 8, No. 2, 2011, pp. 1-8.

Mu et al., "Edge Couplers in Silicon Photonic Integrated Circuits: A Review," MDPI, Applied Sciences, 10, 1538, 2020, pp. 1-29.

* cited by examiner

LOW-LEAKAGE ROW DECODER AND MEMORY STRUCTURE INCORPORATING THE LOW-LEAKAGE ROW DECODER

BACKGROUND

Field of the Invention

The present invention relates to memory structures and, more particularly, embodiments of a low-leakage row decoder and a memory structure that incorporates the low-leakage row decoder.

Description of Related Art

Key factors considered in modern integrated circuit design include, but are not limited to, performance, power consumption, and size scaling. In memory circuits, such as static random access memory (SRAM) circuits, a major component of leakage power consumption is the peripheral circuitry (e.g., row decoder, column decoder and sense circuit). To minimize leakage power consumption associated with the peripheral circuitry, memory circuits are often configured to operate in a "light sleep mode". Specifically, a memory circuit can be configured so that, if it remains idle for some predetermined period of time, it will enter a light sleep mode during which the peripheral circuitry is powered-down. However, when the memory circuit is not idle and, more particularly, when the memory circuit is in a normal active mode, leakage power consumption still remains high.

SUMMARY

Generally, disclosed herein are embodiments of a structure. The structure can include first devices and second devices. Each one of the second devices can be connected in series with a corresponding one of the first devices. The first devices can be electrically connected to a first voltage rail (e.g., a positive supply voltage rail, also referred to herein as a VDD rail). The second devices can be electrically connected to a second voltage rail (e.g., a negative supply voltage rail or a ground rail, also referred to herein as a VSS rail). The structure can also include a first switch (also referred to herein as a header) and a second switch (also referred to herein as a footer). The first switch can be connected between the first voltage rail and the second devices and controlled by a first control signal. The second switch can be connected between the second voltage rail and the first devices and controlled by a second control signal. Furthermore, the first control signal and the second control signal can be clock signal-dependent control signals.

More specifically, disclosed herein are embodiments of a row decoder structure. The row decoder structure can include wordline driver circuitry. The wordline driver circuitry can include first logic gates and second logic gates. Each one of the second logic gates can be connected in series between a corresponding one of the first logic gates and a corresponding wordline for a row of memory cells in a memory array. The first logic gates can be electrically connected to a first voltage rail (e.g., a positive supply voltage rail, also referred to herein as a VDD rail). The second logic gates can be electrically connected to a second voltage rail (e.g., a negative supply voltage rail or a ground rail, also referred to herein as a VSS rail). The structure can also include a first switch (also referred to herein as a header) and a second switch (also referred to herein as a footer). The first switch can be connected between the first voltage rail and the second devices and controlled by a first control signal. The second switch can be connected between the second voltage rail and the first devices and controlled by a second control signal. Furthermore, the first control signal and the second control signal can be clock signal-dependent control signals.

Also disclosed herein are embodiments of a memory structure incorporating the above-described row decoder structure. The memory structure can include an array of memory cells arranged in columns and rows. The memory structure can further include wordlines for the rows, respectively; and a row decoder connected to each of the wordlines. Specifically, the row decoder can include wordline driver circuitry. The wordline driver circuitry can include first logic gates and second logic gates. Each one of the second logic gates can be connected in series between a corresponding one of the first logic gates and a corresponding wordline for a row of memory cells in the array. The first logic gates can be electrically connected to a first voltage rail (e.g., a positive supply voltage rail, also referred to herein as a VDD rail). The second logic gates can be electrically connected to a second voltage rail (e.g., a negative supply voltage rail or a ground rail, also referred to herein as a VSS rail). The structure can also include a first switch (also referred to herein as a header) and a second switch (also referred to herein as a footer). The first switch can be connected between the first voltage rail and the second devices and controlled by a first control signal. The second switch can be connected between the second voltage rail and the first devices and controlled by a second control signal. Furthermore, the first control signal and the second control signal can be clock signal-dependent control signals.

In the above-described structure embodiments, leakage power consumption of the wordline driver circuitry of the row decoder is minimized while the memory structure is idle and also while the memory structure operates in a normal active mode (e.g., between read and/or write operations). Additionally, the need for a light sleep mode of operation is eliminated and, thus, so is the need for any additional components required to implement such a light sleep mode.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
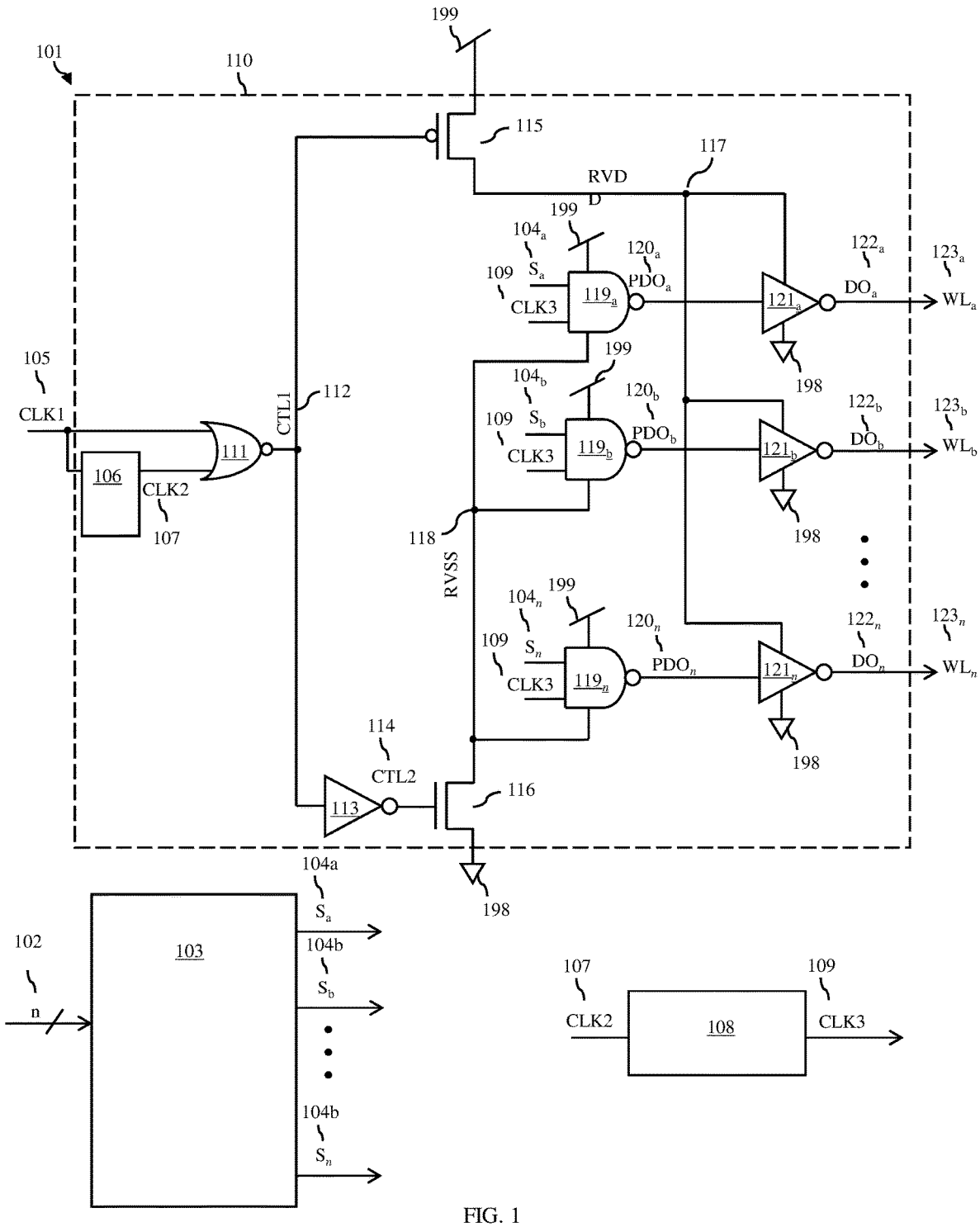
FIG. 1 is a schematic diagram illustrating disclosed embodiments of a low-leakage row decoder for a memory circuit.

As mentioned above, in memory circuits, such as static random access memory (SRAM) circuits, a major component of leakage power consumption is the peripheral circuitry (e.g., row decoder, column decoder and sense circuit). To minimize leakage power consumption associated with the peripheral circuitry, memory circuits are often configured to operate in a "light sleep mode". Specifically, a memory circuit can be configured so that, if it remains idle for some predetermined period of time, it will enter a light sleep mode during which the peripheral circuitry is powered-down. However, when the memory circuit is not idle and, more particularly, when the memory circuit is in a normal active mode, leakage power consumption still remains high.

In view of the foregoing, disclosed herein are embodiments of a low-leakage row decoder and of a memory circuit incorporating the low-leakage row decoder. The disclosed row decoder embodiments can include wordline driver circuitry including first devices (also referred to herein as wordline pre-drivers) and second devices (also referred to herein as wordline drivers). Each second device can be connected in series between a first device and a wordline for a row in a memory array. The wordline driver circuitry can also include a header and a footer. However, instead of the header connecting each of the first and second devices to a positive supply voltage rail (also referred to herein as a first voltage rail or a VDD rail) and the footer connecting each of the first and second device to a negative supply voltage or ground rail (also referred to herein as a second voltage rail or VSS rail) so that the wordline driver circuitry can be selectively powered down in response to a sleep mode enable signal when the memory circuit is determined to be idle (as in the prior art), in the disclosed row decoder embodiments, the first devices are directly connected to the first voltage rail and connected to the second voltage rail through the footer and the second devices are connected to the first voltage rail through the header and directly connected to the second voltage rail. Furthermore, the on/off states of the header and footer are controlled by clock signal-dependent control signals, not sleep mode enable signal-dependent control signals. In the disclosed structure embodiments leakage power consumption is minimized while the memory structure that incorporates the row decoder is idle and also while the memory structure operates in a normal active mode (e.g., between read and/or write operations). Additionally, the need for a light sleep mode of operation is eliminated and, thus, so is the need for additional hardware required for implementing such a light sleep mode of operation including, for example: an input control pin; and additional isolation switches (e.g., n-type field effect transistors) for selectively connecting the wordlines to ground during such the light sleep mode in order to prevent high impedance (hi-Z) or floating of the wordlines.

Referring to FIG. 1, disclosed herein are embodiments of a row decoder 101. Like conventional row decoders, the row decoder 101 can include row address decode logic and a wordline driver circuitry. However, unlike in conventional row decoders, the wordline driver circuitry 110 in the row decoder 101 can be uniquely configured and, more particularly, can have a clocked power gating scheme to reduce leakage power consumption.

More particularly, the row decoder 101 can include row address decode logic 103. The row address decode logic 103 can be configured to receive a row address 102 and, given the row address, to output row-specific wordline select signals ($S_a$-$S_n$) 104a-104n, respectively. Row address decode logic is well known in the art and, thus, the details have been omitted from this specification in order to allow the reader to focus on the salient aspects of the disclosed embodiments. It should be understood that the row address 102 input into the row address decode logic 103 will identify a specific wordline of multiple wordlines ($WL_a$-$WL_n$) 123a-123n in a memory structure and the wordline select signals 104a-104n output from the row address decode logic 103 will include one wordline select signal with a logical high level (i.e., 1) for the specific wordline identified by the row address 102 and all other wordline select signals with a logical low level (i.e., 0).

The row decoder 101 can further include wordline driver circuitry 110 connected to the row address decode logic 103. The wordline driver circuitry 110 can be configured to receive the wordline select signals 104a-104n from the row address decode logic 103 and to selectively activate one specific wordline of the multiple wordlines 123a-123n in response to the wordline select signals 104a-104n (i.e., to switch the wordline voltage (VWL) on one specific wordline from a logical low level to a logical high level, e.g., from ground to VDD, to enable a read or write operation). Specifically, the wordline driver circuitry 110 can include first devices 119a-119n (also referred to herein as wordline pre-drivers) and second devices 121a-121n (also referred to herein as wordline drivers). Each one of the second devices 121a-121n can be connected in series between a corresponding one of the first devices 119a-119n and a corresponding one of the wordlines 123a-123n.

Figure 2A:
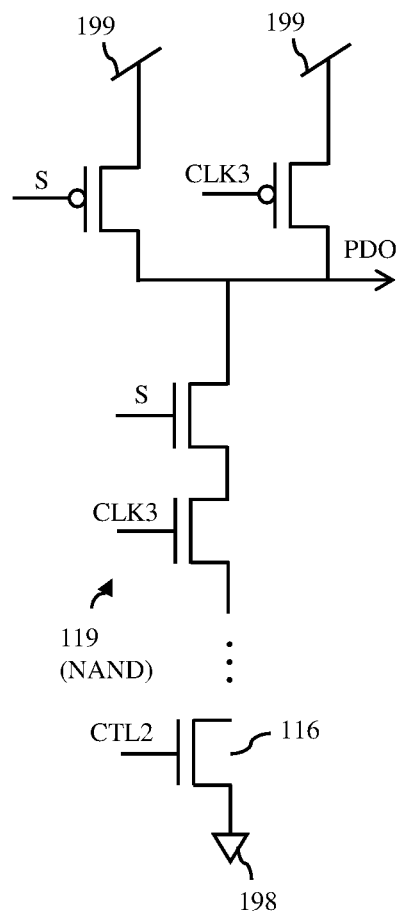
FIG. 2A is a schematic diagram illustrating a first device (e.g., a NAND logic gate) that can be incorporated into the row decoder of FIG. 1.

Each first device 119a-119n can be configured to generate a wordline pre-driver output signal ($PDO_a$-$PDO_n$) 120a-120n based on both the corresponding wordline select signal 104a-104n received from the row address decode logic 103 and a clock signal (CLK3) 109 (see detailed discussed below regarding generation of this clock signal 109, which is also referred to herein as a third clock signal). For example, the first devices 119a-119n can be first logic gates and, particularly, dual input-single output logic gates. Each first logic gate can receive two digital inputs (namely a row-specific wordline select signal (S) and CLK3) and, based on the logical levels on the two digital inputs, can output a digital output (namely a row-specific wordline pre-driver output signal (PDO)). The first logic gates can be, for example, NAND gates, as illustrated in FIG. 2A. Those skilled in the art will recognize that the digital output of a NAND gate will be at a logical high level (i.e., 1) when the two digital inputs are both at logical low levels (i.e., 0, 0) and when the two digital inputs are at different logical levels (i.e., 0,1 or 1,0), but will be at a logical low level (i.e., 0) when the two digital inputs are both at logical high levels (i.e., 1, 1). Thus, a wordline pre-driver output signal (PDO) output from a first device comprising a NAND gate will only be at a logical low level (i.e., 0) when both the wordline select signal (S) and CLK3 received by that first device are both at logical high levels (i.e., 1, 1).

Figure 2C:
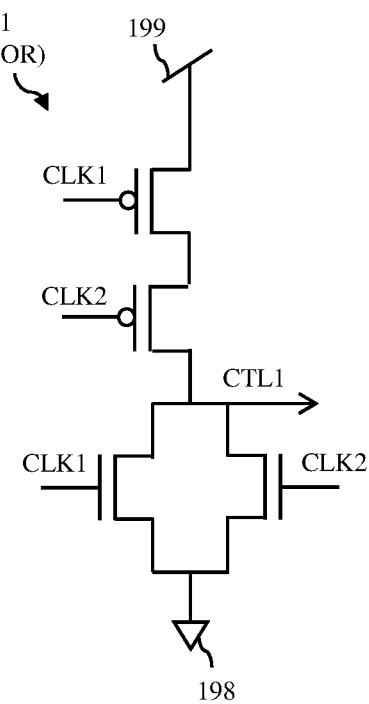
FIG. 2C is a schematic diagram illustrating a third device (e.g., a NOR logic gate) that can be incorporated into the row decoder of FIG. 1.
Figure 2B:
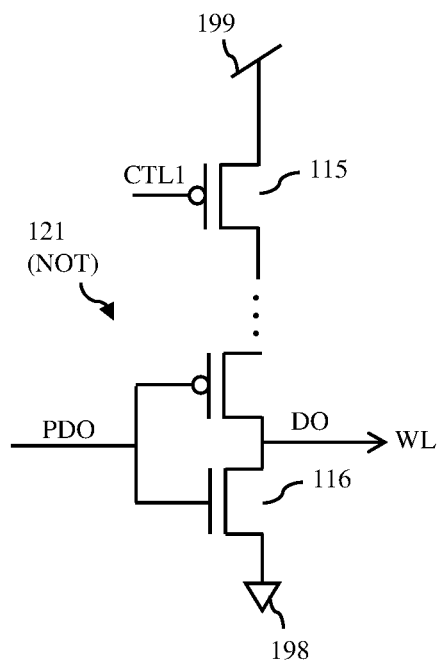
FIG. 2B is a schematic diagram illustrating a second device (e.g., a NOT logic gate) that can be incorporated into the row decoder of FIG. 1.

The second devices 121a-121n can be configured to receive the wordline pre-driver output signals 120a-120n from the first devices 119a-119n, respectively. The second devices 121a-121n can further be configured to generate and output wordline driver output signals ($DO_a$-$DO_n$) 122a-122n based on the wordline pre-driver output signals 120a-120n, respectively. For example, the second devices 121a-121n can be second logic gates and, particularly, inverters (also referred to as NOT gates, as illustrated in FIG. 2B). Those skilled in the art will recognize that the digital output of an inverter or NOT gate will be a logical low level (i.e., 0) when the digital input is at a logical high level (i.e., 1) and vice versa. Thus, a wordline driver output signal generated and output by a second device comprising an inverter will be at a logical low level (i.e., 0) when the wordline pre-driver output signal received by that second device is at a logical high level (i.e., 1) and at a logical high level (i.e., 1) when the wordline pre-driver signal received by that second device is at a logical low level (i.e., 0). When the wordline driver output signal output to a wordline from a second device is at a logical low level, the wordline voltage (VWL) on that wordline will remain at a low voltage level. However, when the wordline driver output signal output signal output to a wordline from a second device switches to a logical high level, then the wordline voltage (VWL) on that wordline increases to VDD (i.e., the wordline is selectively activated to enable the performance of a read or write operation).

As mentioned above, the wordline driver circuitry 110 is uniquely configured and, more particularly, has a clocked power gating scheme to reduce leakage power consumption. Specifically, in the wordline driver circuitry 110, the first devices 119a-119n are each electrically connected to a first voltage rail 199 (e.g., a positive supply voltage rail, also referred to herein as a VDD rail). The second devices 121a-121n are each electrically connected to a second voltage rail 198 (e.g., a negative supply voltage rail or a ground rail, also referred to herein as a VSS rail).

The wordline driver circuitry 110 can further include a first switch 115 (also referred to herein as a header). The first switch 115 can be, for example, a p-type field effect transistor (PFET), which is connected between the first voltage rail 199 and the second devices 121a-121n. That is, the PFET-type first switch 115 can have a first source node connected to the first voltage rail 199 and a first drain node 117 connected to each one of the second devices 121a-121n (e.g., as shown in FIG. 2B). The PFET-type first switch 115 can further be controlled by a first control signal (CTL1) 112. That is, the PFET-type first switch 115 can have a gate and a first control signal 112 can be applied to the gate to control the on/off state. Specifically, when the first control signal 112 is at a logical low level (i.e., 0), the PFET-type first switch 115 is in an on state and the second devices 121a-121n are all electrically connected to the first voltage rail 199, whereas when the first control signal 112 is at a logical high level (i.e., 1), the PFET-type first switch 115 is in an off state and the second devices 121a-121n are all disconnected from the first voltage rail 199.

The wordline driver circuitry 110 can further include a second switch 116 (also referred to herein as a footer). The second switch 116 can be, for example, an n-type field effect transistor (NFET), which is connected between the second voltage rail 198 and the first devices 119a-119n. That is, the NFET-type second switch 116 can have a second source node connected to the second voltage rail 198 and a second drain node 118 connected to each one of the first devices 119a-119n (e.g., as shown in FIG. 2A). The NFET-type second switch 116 can further be controlled by a second control signal (CTL2) 114. That is, the NFET-type second switch 116 can have a gate and a second control signal 114 can be applied to the gate to control the on/off state. Specifically, when the second control signal 114 is at a logical high level (i.e., 1), the NFET-type second switch 116 is in an on state and the first devices 119a-119n are all electrically connected to the second voltage rail 198, whereas when the second control signal 114 is at a logical low level (i.e., 0), the NFET-type second switch 116 is in an off state and the first devices 119a-119n are all disconnected from the second voltage rail 198.

Furthermore, within the wordline driver circuitry 110, the first control signal 112 and the second control signal 114, which as discussed above control the on/off states of the first switch 115 and the second switch 116, respectively, can be clock signal-dependent control signals. More specifically, the wordline driver circuitry 110 can further include a clock pulse generator 106. This clock pulse generator 106 can be configured to receive a first clock signal (CLK1) 105 (e.g., from an external clock signal generator) and to generate and output a second clock signal (CLK2) 107 using the first clock signal 105. The second clock signal 107 can be generated by the clock pulse generator 106 such that the rising clock-edge of the second clock signal 107 follows shortly after (e.g., two inverter delay) the rising clock-edge of the first clock signal 105, such that the pulse width of the second clock signal 107 is independent of the pulse width of first clock signal 105. CLK2 pulse is internally self-timed such that the pulse repetition frequency (PRF) is approximately the same. Clock pulse generators capable of generating one clock signal from another (as described above) are well known in the art and, thus, the details thereof have been omitted from this specification in order to allow the reader to focus on the salient aspects of the disclosed structure embodiments.

Figure 2D:
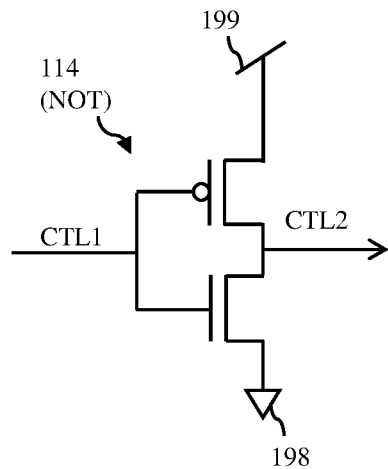
FIG. 2D is a schematic diagram illustrating a fourth device (e.g., another NOT logic gate) that can be incorporated into the row decoder of FIG. 1.

The wordline driver circuitry 110 can also include a third device 111 and a fourth device 113. The third device 111 can be configured to receive the first clock signal 105 and the second clock signal 107, as inputs, and to generate and output the first control signal 112 (CTL1) to both the first switch 115 and the fourth device 113. As mentioned above, the first control signal 112 can control the on/off state of the first switch 115. The fourth device 113 can receive the first control signal 112, as an input, and can generate and output the second control signal 114 (CTL2) to the second switch 116. As mentioned above, the second control signal 114 can control the on/off state of the second switch 116. For example, the third device 111 can be a dual input-single output logic gate and, particularly, a NOR gate, as illustrated in FIG. 2C, and the fourth device 113 can be an inverter (also referred to herein as a NOT gate, as illustrated in FIG. 2D). Those skilled in the art will recognize that the digital output of a NOR gate will be at a logical low level (i.e., 0) when the two digital inputs are both at logical high levels (i.e., 1, 1) and when the two digital inputs are at different logical levels (i.e., 0,1 or 1,0), but will be at a logical high level (i.e., 1) when the two digital inputs are both at logical low levels (i.e., 0, 0). Again, those skilled in the art will recognize that the digital output of an inverter or NOT gate will be a logical low level (i.e., 0) when the digital input is at a logical high level (i.e., 1) and vice versa.

Therefore, the first control signal 112 output from a third device comprising a NOR gate is clock signal-dependent and will only be at a logical high level (i.e., 1) turning off the PFET-type first switch 115 when both the first clock signal 105 and the second clock signal 107 received by that third device 111 are both at logical low levels (i.e., 0, 0). Furthermore, the second control signal 114 output from a fourth device comprising an inverter will only switch to a logical low level (i.e., 0) turning off the NFET-type second switch 116 after the first control signal 112 has switched to the logical high value. Thus, if the first switch turns on, so will the second switch and vice versa. When the PFET-type first switch 115 is turned off, the drain node 117 of that first switch will no longer be maintained at VDD (i.e., it will float) and the potential leakage current path from the first voltage rail 199 to the second voltage rail 198 through each of the second devices 121a-121n is blocked. Similarly, when the NFET-type second switch 116 is turned off, the drain node 118 of that second switch will no longer be maintained at VSS (i.e., it will float) and the potential leakage current path from the first voltage rail 199 to the second voltage rail 198 through each of the first devices 119a-119n is also blocked.

As mentioned above, the inputs to the first devices 119a-119n can be a corresponding wordline select signal 104a-104n received from the row address decode logic 103 and the third clock signal (CLK3) 109. The wordline driver circuitry 110 can further include a delay circuit 108. This delay circuit 108 can be configured to receive the second clock signal 107 and to generate and output the third clock signal 109 such that the third clock signal 109 is a delayed version of the second clock signal 107. The delay can be two or four Inverter delay stages. Delay circuits capable of generating and outputting a delayed version of a clock signal (as described above) are well known in the art and, thus, the details thereof have been omitted from this specification in order to allow the reader to focus on the salient aspects of the disclosed structure embodiments.

Figure 3:
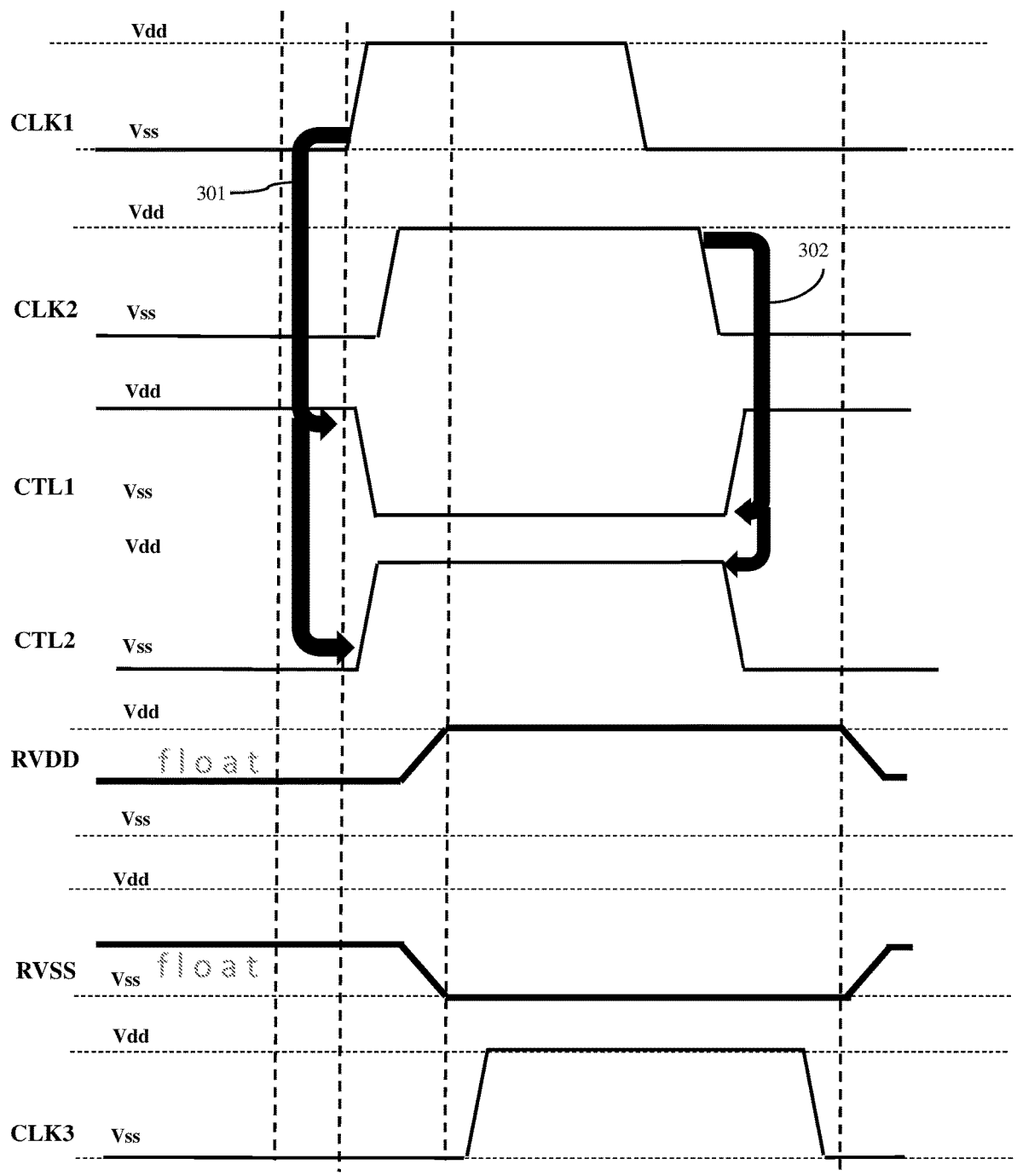
FIG. 3 is a waveform diagram illustrating the various signals required for operation of the row decoder of FIG. 1 including a first clock signal (CLK1), a second clock signal (CLK2), a first control signal (CTL1), a second control signal (CTL2), a voltage level (RVDD), another voltage level (RVSS), and the third clock signal (CLK3)

FIG. 3 is a waveform diagram illustrating the various signals described above and required for row decoder 101 operation including the first clock signal (CLK1) 105, the second clock signal (CLK2) 107, the first control signal (CTL1) 112, the second control signal (CTL2) 114, the voltage level (RVDD) on the first drain node 117 of the first switch 115, the voltage level (RVSS) on the second drain node 118 of the second switch 116, and the third clock signal (CLK3) 109. It should be noted that switching of the first control signal (CTL1) 112 to a low state and switching of the second control signal (CTL2) to a high state are triggered on the rising edge of the first clock signal (CLK1), as indicated by arrows 301; whereas switching of the first control signal (CTL1) 112 back to the high state and switching of the second control signal (CTL2) back to the low state are triggered on the falling edge of the second clock signal (CLK2), as indicated by arrows 302. Furthermore, the second clock signal 107 and the third clock signal 109 should be generated so that the first switch 115 and the second switch 116 are turned on, thereby pulling up the first drain node 117 to VDD and pulling down the second drain node 118 to VSS prior to the rising edge of the third clock signal 109 (i.e., prior to the initiation of any read or write operation resulting in zero-delay impact). The second clock signal 107 and the third clock signal 109 should also be generated so that the first switch 115 and second switch 116 are turned off and the first drain node 117 and the second drain node 118 are allowed to float, only after the falling edge of the third clock signal 109 (i.e., only after the completion of any read or write operation).

Figure 4:
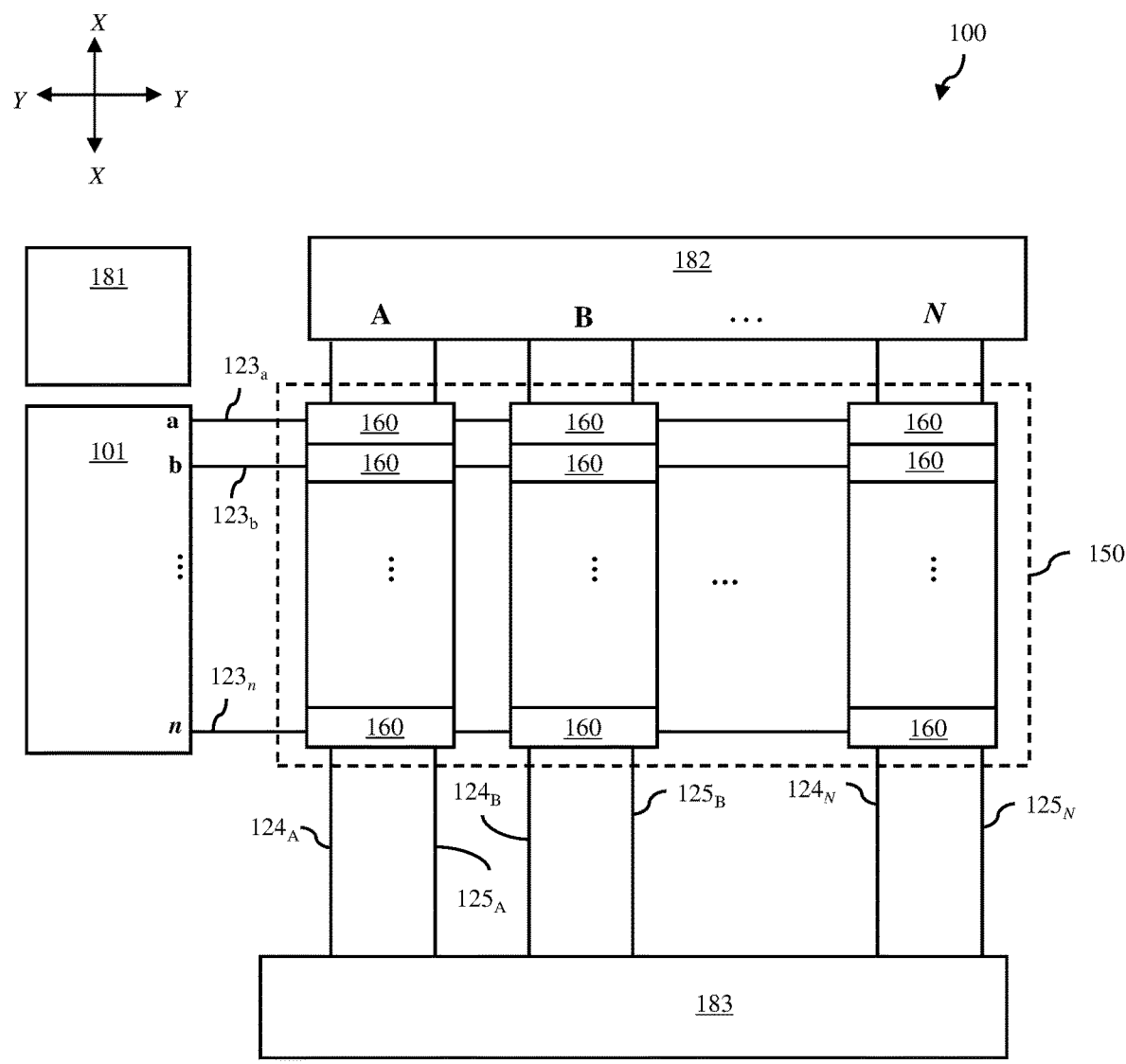
FIG. 4 is a schematic diagram illustrating an exemplary embodiment of a memory structure incorporating the row decoder of FIG. 1.

Referring to FIG. 4, also disclosed herein are embodiments of a memory structure 100 incorporating the above-described low-leakage row decoder structure 101.

Specifically, the memory structure 100 can be, for example, a static random access memory (SRAM) circuit or any other suitable memory circuit that employs a row decoder (e.g., DRAM, MRAM, Flash, OTP etc.). The memory circuit structure can include an array 150 of memory cells 160, which are arranged in columns A-N and rows a-n. The memory structure 100 can further include at least one bitline per column. For example, if the memory structure comprises an SRAM circuit, it can include a complementary bitline pair for each column (i.e., a bitline true (BLT) and a bitline complement (BLC) for each column). For example, see BLT 124A and BLC 125A for column A, BLT 124B and BLC 125B for column B, and so on. The memory structure can further include a wordline (WL) for each row. For example, see WL 123a for row a, WL 123b for row b, and so on. Those skilled in the art will recognize that the total number of bitlines per column and the total number of wordlines per row will depend upon the type of memory cells employed.

Figure 5:
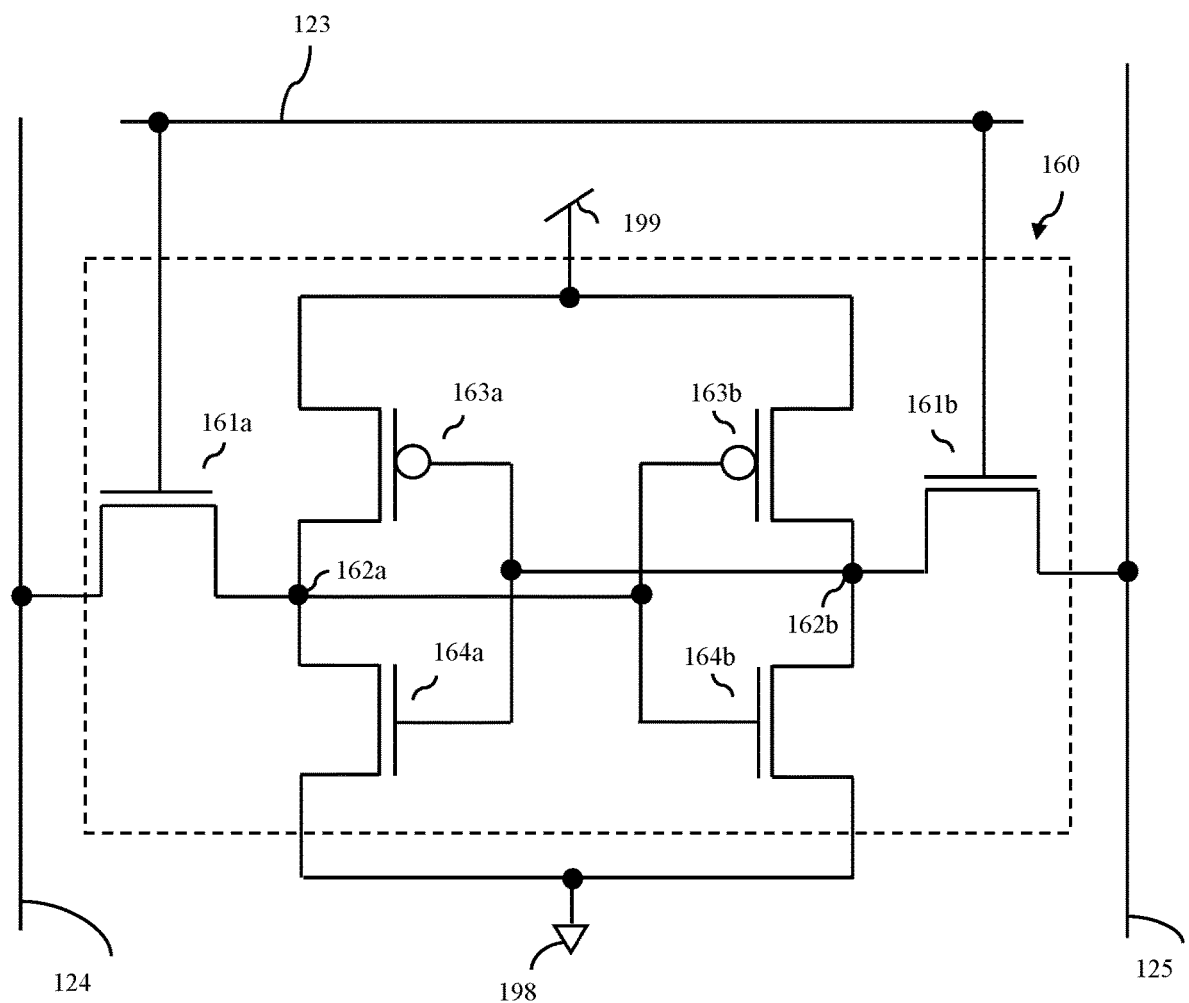
FIG. 5 is a schematic diagram illustrating an exemplary 6T-SRAM cell that can be incorporated into a memory array in the memory structure of FIG. 4.

For purposes of illustration, the memory cells 160 are described below and illustrated in the drawings as being six-transistor (6T) SRAM cells. As illustrated in FIG. 5, a 6T-SRAM cell 160 can include: two pass-gate transistors (e.g., two N-type field effect transistors (NFETs)); two pull-up transistors (e.g., two P-type field effect transistors (PFETs)); and two pull-down transistors (e.g., two additional NFETs). Specifically, a 6T-SRAM cell 160 can include a first inverter and a second inverter. The first inverter can include a first pull-up transistor 163a (e.g., a PFET) and a first pull-down transistor 164a (e.g., an NFET) connected in series between a first voltage rail 199 (e.g., a positive supply voltage rail, also referred to herein as a VDD rail) and a second voltage rail 198 (e.g., a ground rail or negative supply voltage rail, also referred to herein as a VSS rail). The second inverter can include a second pull-up transistor 163b (e.g., another PFET) and a second pull-down transistor 164b (e.g., another NFET) connected in series between the same voltage rails. The first and second inverters can be cross-coupled. That is, the gates of the second pull-up transistor 163b and the second pull-down transistor 164b can be connected to a first data node 162a, which is a junction between the first pull-up transistor 163a and the first pull-down transistor 164a. Additionally, the gates of the first pull-up transistor 163a and the first pull-down transistor 164a can be connected to a second data node 162b, which is at the junction between the second pull-up transistor 163b and the second pull-down transistor 164b. The 6T-SRAM cell 160 can also include a pair of pass-gate transistors (e.g., NFETs) including a first pass-gate transistor 161a, which is connected in series between a BLT 124 for a column and the first data node 162a, and a second pass-gate transistor 161b, which is connected in series between BLC 125 for the same column and the second data node 162b. The gates of the first and second pass-gate transistors 161a and 161b can be connected to the WL 123 for a particular row.

Those skilled in the art will recognize that such a 6T SRAM cell 160 can operate in three different modes: standby, write and read. In the standby mode, the cell is idle. In the write mode, a data value is written into the cell. Specifically, if a data value of "1" is to be written to the first data node 162a, BLC 125 is set at a first or low voltage level (e.g., discharged to ground (GND) and BLT 124 is charged to a second voltage level (e.g., VDD) that is greater than the first voltage level. WL 123 is selectively activated (i.e., switched to VDD) in order to turn on the first and second pass-gate transistors 161a and 161b, thereby storing the data value of "1" on the first data node 162a. Contrarily, if a data value of "0" is to be written to the first data node 162a, BLT 124 is discharged and BLC 125 is charged to the second voltage level. Then, the WL 123 is selectively activated in order to turn on the first and second pass-gate transistors 161a and 161b, thereby storing the data value of "0" on the first data node 162a. In the read mode, a stored data value on the first data node 162a is read out. Specifically, BLT 124 and BLC 125 are both pre-charged to the second voltage level and the WL 123 is selectively activated in order to turn on the first and second pass-gate transistors 161a and 161b. When a data value of "1" is stored on the first data node 162a, BLT 124 will remain charged at its pre-charge voltage level and the voltage level on BLC 125 will be pulled down through the second pass-gate transistor 161b and the second pull-down transistor 164b. When a data value of "0" is stored on the first data node 162a, the voltage level on BLT 124 will be pulled down through the first pass-gate transistor 161a and the first pull-down transistor 164a and BLC 125 will remain charged at its pre-charge voltage level. The description of the 6T-SRAM cell set forth above is offered for illustration purposes and is not intended to be limiting. It should be understood that memory cells 160 that are incorporated into the memory array 150 could, alternatively, be 6T SRAM cells with a different configuration, different types of SRAM cells (e.g., eight transistor (8T) SRAM cells, ten transistor (10T) SRAM cells, etc.) or different types of memory cells that similarly require activation of a wordline for the performance of a read or write operation.

The memory structure 100 can further include a controller 181 and peripheral circuitry, which is configured to operate in response to control signals from the controller 181. Specifically, the peripheral circuitry can include a low-leakage row decoder 101, which, as discussed in detail above and illustrated in FIG. 1, can be connected to the wordlines 123a-123n for the rows and can include, for example, address decode logic 103, delay circuit 108, and the wordline driver circuitry 110 for selectively activating one specific wordline for one specific row (e.g., for switching the wordline for a specific row from ground to VDD) to enable a read or write operation in a memory cell, which is contained within the specific row and which is connected to the specific wordline. The peripheral circuitry can also include a column decoder 182, which is electrically connected to the bitline(s) for the columns and which can include, for example, column address decode logic and bitline driver circuitry for appropriately biasing selected bitlines depending upon the mode of operation. The peripheral circuitry can also include a sense circuit 183 that is configured to enable reading out of stored data from the memory cells 160 within the array 150. It should be understood that, while the low-leakage row decoder 101 is unique (as discussed), controllers, column decoders and sense circuits are well known components of memory structures and, thus, the details thereof have been omitted from this specification in order to allow the reader to focus on the salient aspects of the disclosed structure embodiments.

Figure 6:
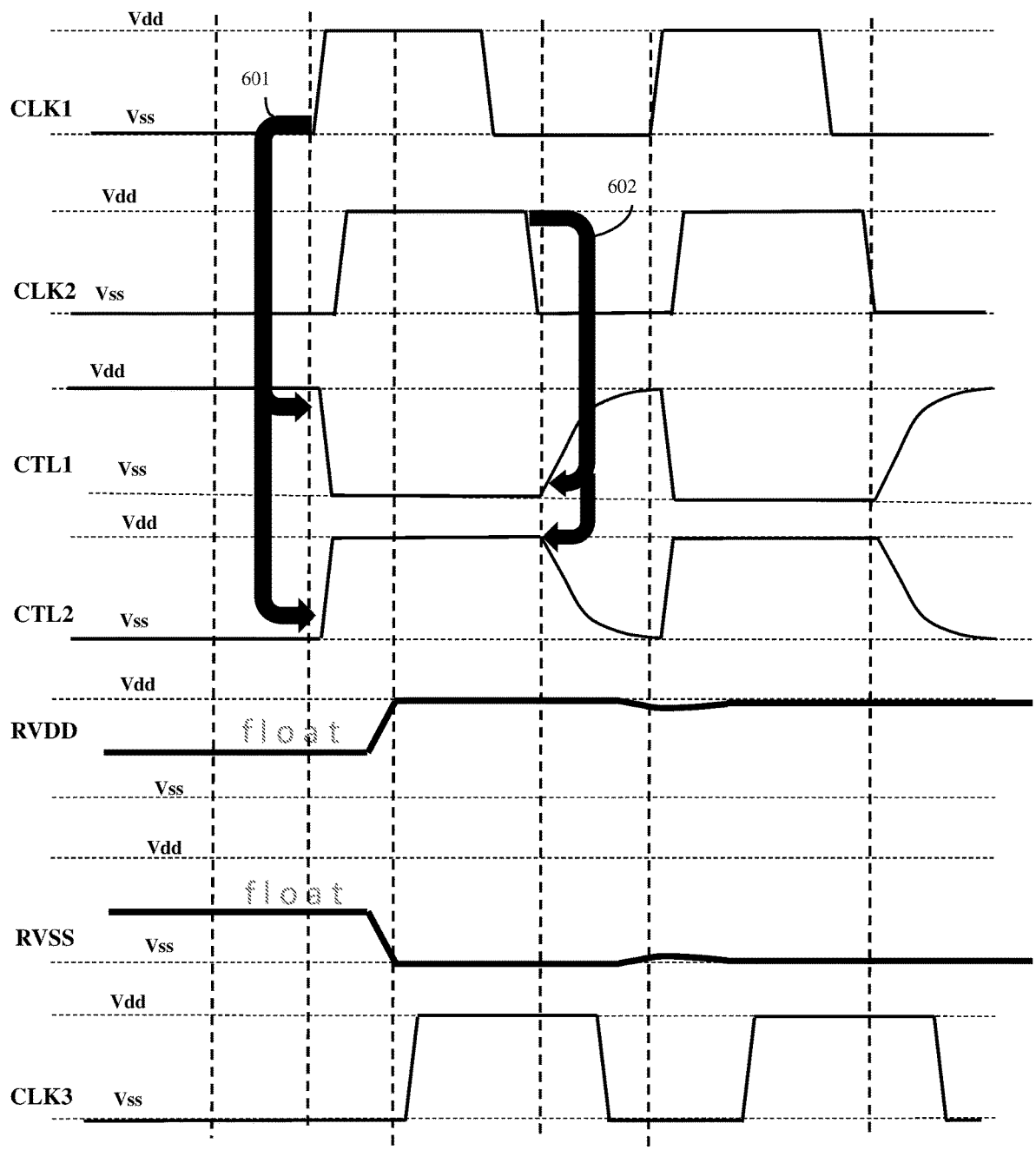
FIG. 6 is a waveform diagram illustrating the same signals shown in FIG. 3 when the row decoder is incorporated into a memory structure such as the memory structure of FIG. 4.

FIG. 6 is a waveform diagram illustrating the various signals described above and required for row decoder 101 operation within the memory structure 100 including the first clock signal (CLK1) 105, the second clock signal (CLK2) 107, the first control signal (CTL1) 112, the second control signal (CTL2) 114, the voltage level (RVDD) on the first drain node 117 of the first switch 115, the voltage level (RVSS) on the second drain node 118 of the second switch 116, and the third clock signal (CLK3) 109. As discussed above, with regard to the waveforms shown in FIG. 3, switching of the first control signal (CTL1) 112 to a low state and switching of the second control signal (CTL2) to a high state are triggered on the rising edge of the first clock signal (CLK1), as indicated by arrows 601; whereas switching of the first control signal (CTL1) 112 back to the high state and switching of the second control signal (CTL2) back to the low state are triggered on the falling edge of the second clock signal (CLK2), as indicated by arrows 602. Furthermore, the second clock signal 107 and the third clock signal 109 should be generated so that the first switch 115 and the second switch 116 are turned on, thereby pulling up the first drain node 117 to VDD and pulling down the second drain node 118 to VSS prior to the rising edge of the third clock signal 109 (i.e., prior to the initiation of any read or write operation). The second clock signal 107 and the third clock signal 109 should also be generated so that the first switch 115 and second switch 116 are turned off and the first drain node 117 and the second drain node 118 are allowed to float, only after the falling edge of the third clock signal 109 (i.e., only after the completion of any read or write operation). It should be noted that multiple clock cycles are illustrated in FIG. 6 and, in this case, the waveforms for the voltage levels on the first drain node 117 of the first switch 115 and the second drain node 118 of the second switch 116 do not fall and rise, respectively, when the first switch 115 and second switch 116 both turned off between pulses of the second clock signal 107. This is due to incorporation of the row decoder 101 into the memory structure 100 and the resulting huge capacitance load and capacitance coupling. Specifically, in the absence of adjacent wiring, turning off the first switch 115 and the second switch 116 of the wordline driver circuitry 110 of the row decoder 101 would result in the voltage level on the first drain node 117 dropping and the voltage level on the second drain node 118 rising. However, due to huge capacitance load and capacitance coupling with adjacent wiring within the memory structure 100, the voltage levels on the first drain node 117 of the first switch 115 and the second drain node 118 of the second switch 116 are prevented from significantly changing during the short period of time between pulses of the second clock signal 107 (i.e., remain essentially constant), as illustrated. Furthermore, even though the voltage levels on the first drain node 117 of the first switch 115 and the second drain node 118 of the second switch 116 do not change significantly when the switches 115 and 116 are turned off for short periods of time, leakage power consumption is still minimized because the potential leakage current paths from the first voltage rail 199 to the second voltage rail 198 through each of the second devices 121a-121n and from the first voltage rail 199 to the second voltage rail 198 through each of the first devices 119a-119n are still blocked.

In the structure embodiments described above, leakage power consumption of the wordline driver circuitry 110 within the row decoder 101 is minimized while the memory structure 100 that incorporates the row decoder 101 is idle and also while the memory structure operates in a normal active mode (e.g., between performing read and/or write operations). Additionally, the need for a light sleep mode of operation is eliminated and, thus, so is the need for any additional components required to implement such a light sleep mode including, but not limited to, additional switches (e.g., n-type field effect transistor) to connect the wordlines to ground during such the light sleep mode in order to prevent high impedance (hi-Z) or floating of the wordlines.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   row address decode logic configured to output row-specific wordline select signals for wordlines, respectively;
   first devices connected to a first voltage rail, wherein each one of the first devices is configured to receive two first inputs and to output a first output and wherein one of the two first inputs is a row-specific wordline select signal from the row address decode logic;
   second devices connected to a second voltage rail, wherein each one of the second devices is connected in series between one of the first devices and one of the wordlines so that each one of the second devices receives, as a second input, the first output from the one of the first devices and outputs a second output to the one of the wordlines;
   a first switch connected between the first voltage rail and the second devices; and
   a second switch connected between the second voltage rail and the first devices,
   wherein the first switch is controlled by a first control signal, wherein the second switch is controlled by a second control signal that is inverted relative to the first control signal, and wherein the first control signal and the second control signal are clock signal-dependent.

2. The structure of claim 1,
   wherein the first voltage rail comprises a positive supply voltage rail and the second voltage rail comprises a negative supply voltage rail or a ground rail, and
   wherein the first switch comprises a p-type field effect transistor and the second switch comprises an n-type field effect transistor.

3. The structure of claim 2, further comprising:
   a pulse generator configured to receive a first clock signal and to output a second clock signal;
   a third device configured to receive the first clock signal and the second clock signal and to output the first control signal to the first switch; and
   a fourth device comprising an inverter configured to receive the first control signal and to output the second control signal to the second switch,
   wherein, when both the first clock signal and the second clock signal are at a logical low level, the first control signal switches to a logical high level turning off the p-type field effect transistor to disconnect the first devices from the first voltage rail and the second control signal switches to a logical low level turning off the n-type field effect transistor to disconnect the second devices from second voltage rail.

4. The structure of claim 3, wherein the third device comprises a NOR gate.

5. The structure of claim 1, wherein the first devices and the second devices comprise logic gates.

6. The structure of claim 1, wherein the first devices comprise dual input-single output logic gates.

7. The structure of claim 1, wherein the first devices comprise NAND gates and wherein the second devices comprise inverters.

8. A structure comprising:
   row address decode logic configured to output row-specific wordline select signals for wordlines, respectively, of rows of memory cells in a memory array;
   first logic gates connected to a first voltage rail, wherein each one of the first logic gates is configured to receive two first inputs and to output a first output and wherein one of the two first inputs is a row-specific wordline select signal from the row address decode logic;
   second logic gates connected to a second voltage rail, wherein each one of the second logic gates is connected in series between one of the first logic gates and one of the wordlines;
   a first switch connected between the first voltage rail and the second logic gates; and
   a second switch connected between the second voltage rail and the first logic gates,
   wherein the first switch is controlled by a first control signal, wherein the second switch is controlled by a second control signal that is inverted relative to the first control signal, and wherein the first control signal and the second control signal are clock signal-dependent.

9. The structure of claim 8,
wherein the first voltage rail comprises a positive supply voltage rail and the second voltage rail comprises a negative supply voltage rail or a ground rail, and
wherein the first switch comprises a p-type field effect transistor and the second switch comprises an n-type field effect transistor.

10. The structure of claim 9, further comprising:
a pulse generator configured to receive a first clock signal and to output a second clock signal;
a third logic gate configured to receive the first clock signal and the second clock signal and to output the first control signal to the first switch; and
a fourth logic gate comprising an inverter configured to receive the first control signal and to output the second control signal to the second switch,
wherein, when both the first clock signal and the second clock signal are at a logical low level, the first control signal switches to a logical high level turning off the p-type field effect transistor to disconnect the first logic gates from the first voltage rail and the second control signal switches to a logical low level turning off the n-type field effect transistor to disconnect the second logic gates from the second voltage rail.

11. The structure of claim 10, wherein the third logic gate comprises a NOR gate.

12. The structure of claim 10, wherein the first logic gates comprise NAND gates and wherein the second logic gates comprise inverters.

13. The structure of claim 12, wherein the row address decode logic is configured to receive a row address and given the row address, to output the row-specific wordline select signals to the NAND gates, respectively, and wherein the structure further comprises:
a delay circuit configured to receive the second clock signal and to output a third clock signal to the NAND gates,
wherein the two first inputs to each NAND gate comprise the row-specific wordline select signal and the third clock signal such that any specific wordline for any specific row is activated only when both the row-specific wordline select signal for the specific row and the third clock signal are at logical high levels.

14. A structure comprising:
an array of memory cells arranged in columns and rows;
wordlines for the rows, respectively; and
a row decoder comprising:
row address decode logic configured to output row-specific wordline select signals for the wordlines, respectively;
first logic gates connected to a first voltage rail, wherein each one of the first logic gates is configured to receive two first inputs and to output a first output and wherein one of the two first inputs is a row-specific wordline select signal from the row address decode logic;
second logic gates connected to a second voltage rail, wherein each one of the second logic gates is connected in series between one of the first logic gates and a corresponding wordline for a row of the memory cells so each one of the second logic gates receives, as a second input, the first output form the one of the first logic gates and outputs a second output to the corresponding wordline;
a first switch connected between the first voltage rail and the second logic gates; and
a second switch connected between the second voltage rail and the first logic gates,
wherein the first switch is controlled by a first control signal, wherein the second switch is controlled by a second control signal that is inverted relative to the first control signal, and wherein the first control signal and the second control signal are clock signal-dependent.

15. The structure of claim 14,
wherein the first voltage rail comprises a positive supply voltage rail and the second voltage rail comprises a negative supply voltage rail or a ground rail, and
wherein the first switch comprises a p-type field effect transistor and the second switch comprises an n-type field effect transistor.

16. The structure of claim 15, wherein the row decoder comprises:
a pulse generator configured to receive a first clock signal and to output a second clock signal;
a third logic gate configured to receive the first clock signal and the second clock signal and to output the first control signal to the first switch; and
a fourth logic gate comprising an inverter configured to receive the first control signal and to output the second control signal to the second switch,
wherein, when both the first clock signal and the second clock signal are at a logical low level, the first control signal switches to a logical high level turning off the p-type field effect transistor to disconnect the first logic gates from the first voltage rail and the second control signal switches to a logical low level turning off the n-type field effect transistor to disconnect the second logic gates from the second voltage rail.

17. The structure of claim 16, wherein the third logic gate comprises a NOR gate.

18. The structure of claim 16, wherein the first logic gates comprise NAND gates and wherein the second logic gates comprise inverters.

19. The structure of claim 18, wherein the row decoder further comprises:
the row address decode logic configured to receive a row address and given the row address, to output the row-specific wordline select signals to the NAND gates, respectively; and
a delay circuit configured to receive the second clock signal and to output a third clock signal to the NAND gates,
wherein the first inputs to each NAND gate comprise the row-specific wordline select signal and the third clock signal such that any specific wordline for any specific row is activated only when both the row-specific wordline select signal for the specific row and the third clock signal are at logical high levels.

20. The structure of claim 14, wherein the memory cells comprise static random access memory cells.

* * * * *